(12) United States Patent
Hokomoto (10) Patent No.: US 6,855,998 B2
(45) Date of Patent: Feb. 15, 2005

(54) SEMICONDUCTOR DEVICE

(75) Inventor: Yoshitaka Hokomoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/377,790

(22) Filed: Mar. 4, 2003

(65) Prior Publication Data

US 2003/0201464 A1 Oct. 30, 2003

(30) Foreign Application Priority Data

Mar. 26, 2002 (JP) ........................................ 2002-085898

(51) Int. Cl.⁷ .......................................... H01L 27/095
(52) U.S. Cl. ........................ 257/471; 29/576; 317/235
(58) Field of Search ............................. 29/576; 317/235

(56) References Cited

U.S. PATENT DOCUMENTS

| | | | | |
|---|---|---|---|---|
| 3,749,987 A | * | 7/1973 | Anantha | ...................... 257/49 |
| 4,648,173 A | * | 3/1987 | Malaviya | ...................... 438/151 |
| 6,037,632 A | | 3/2000 | Omura et al. | |
| 6,184,555 B1 | | 2/2001 | Tihanyi et al. | |
| 6,239,466 B1 | | 5/2001 | Elasser et al. | |

FOREIGN PATENT DOCUMENTS

| | | | |
|---|---|---|---|
| JP | 9-331063 | 12/1997 | |
| JP | 11-501458 | 2/1999 | |
| JP | 2000-504879 | 4/2000 | |
| JP | 2001-15744 | 1/2001 | |
| JP | 02001274414 A | * 10/2001 | ........... H01L/29/80 |
| JP | 2001-523895 | 11/2001 | |
| WO | WO 97/07533 | 2/1997 | |
| WO | WO 99/26296 | 5/1999 | |

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

A semiconductor device comprises a field effect transistor and a schottky-barrier diode mounted in the same semiconductor substrate, the semiconductor device having buried doped layers buried at a predetermined interval in a drift layer of a first conductivity type in a schottky-barrier diode region so as to have a predetermined depth, the buried doped layers having a second conductivity type.

32 Claims, 7 Drawing Sheets

SEMICONDUCTOR DEVICE

CROSS-REFERENCE TO RELATED APPLICATION

This application is based upon and claims the benefit of priority from the prior Japanese Patent Application No. 2002-085898, filed on Mar. 26, 2002, the entire contents of which are incorporated herein by reference.

BACKGROUND OF THE INVENTION

1. Field of the Invention

The present invention generally relates to a semiconductor device. More specifically, the invention relates to the structure of a trench gate type n-channel field effect transistor wherein a schottky-barrier diode is mounted in the same semiconductor substrate.

2. Related Background Art

Figure 1:
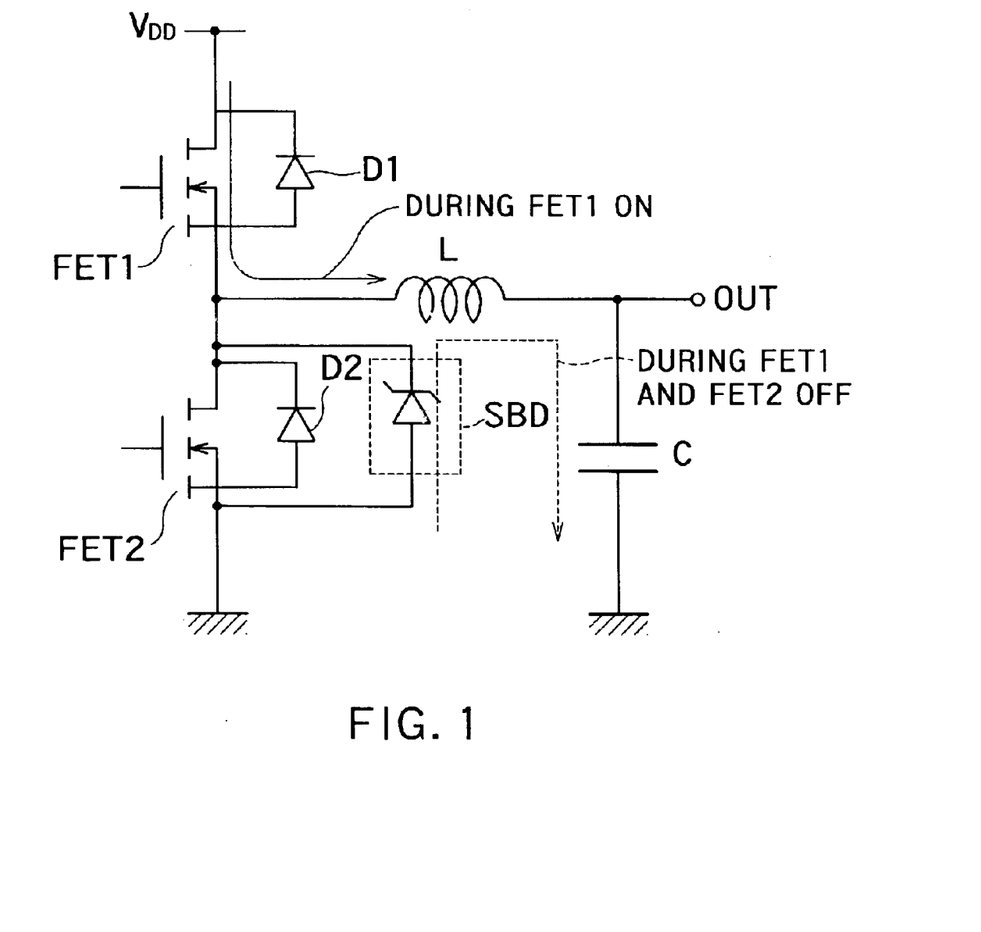
FIG. 1 is a circuit diagram of a typical synchronous commutating circuit using a field effect transistor.

FIG. 1 is a circuit diagram of a typical synchronous commutating circuit in which a field effect transistor is used.

The synchronous commutating circuit shown in FIG. 1 comprises: a first field effect transistor FET1 and a second field effect transistor FET2, which are connected in series between a power supply potential node VDD and a ground potential node; a schottky-barrier diode SBD which is connected to the second field effect transistor FET2 in parallel; an inductance L which is connected to a connection node of the first field effect transistor FET1 and the second field effect transistor FET2 and to an output node OUT; and a capacitor C which is connected to the output node OUT and a ground potential node. Furthermore, reference symbol D1 and D2 denote parasitic diodes of the first and second field effect transistors FET1 and FET2, respectively.

This synchronous commutating circuit is designed to alternately the potential level of the output node OUT by alternately applying a voltage to the gate of the first field effect transistor FET1 or the second field effect transistor FET2.

It is herein assumed that the schottky-barrier diode SBD is not provided, after the gate of the first field effect transistor FE1 is turned off, before the gate of the second field effect transistor FET2 is turned on, a forward current flows through the parasitic diode D2 of the second field effect transistor FET2 by the counter electromotive force of the inductance L, so that a relatively large power loss is caused.

Therefore, in order to reduce this power loss, there are some cases where a schottky-barrier diode SBD is provided between the source and drain of the second field effect transistor FET2.

Figure 2:
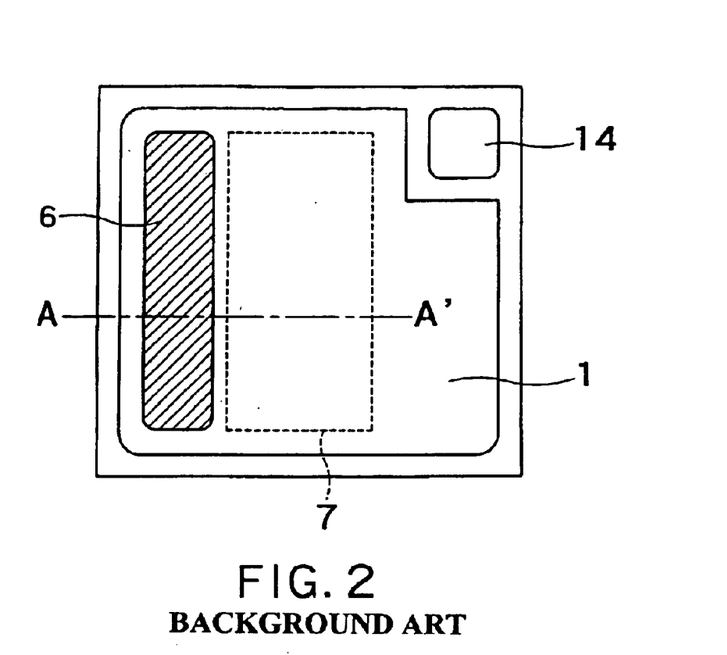
FIG. 2 is a plan view showing a schematic construction on a semiconductor substrate when a field effect transistor and a schottky-barrier diode are mounted on the same substrate.

FIG. 2 is a plan view showing a schematic construction on a semiconductor substrate when a field effect transistor and a schottky-barrier diode are mounted on the same substrate.

When the field effect transistor and the schottky-barrier diode are mounted on the same substrate, a schottky-barrier diode region 6 and a field effect transistor region 7 are separated from each other as shown in FIG. 2. On the other hand, the anode electrode of the schottky-barrier diode and the source electrode of the field effect transistor are formed of a common metal film 1. Furthermore, a gate electrode pad 14 is provided in a corner portion of the semiconductor substrate.

Figure 3:
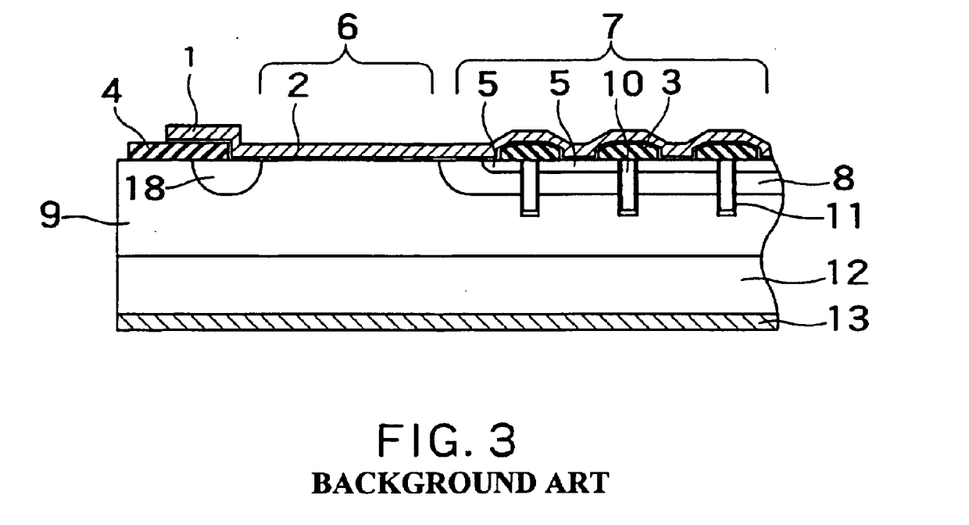
FIG. 3 is a cross-sectional construction drawing of a conventional semiconductor device wherein a field effect transistor and a schottky-barrier diode are mounted on the same substrate.

FIG. 3 is a cross-sectional construction drawing of a conventional semiconductor device wherein a field effect transistor and a schottky-barrier diode are mounted on the same substrate. Furthermore, the cross-section shown in FIG. 3 is a cross-section taken along line AA' in the semiconductor device shown in FIG. 2.

The conventional semiconductor device shown in FIG. 3 comprises: an $n^{++}$-type semiconductor substrate 12; an $n^+$-type epitaxial layer (semiconductor layer) 9 which is a drift layer formed on the $n^{++}$-type semiconductor substrate 12; a p-type base layer 8 which is formed in the vicinity of the surface in a field effect transistor region 7 of the $n^+$-type epitaxial layer 9; an $n^+$-type source layer 5 which is formed in the surface portion of the p-type base layer 8; a gate oxide film (gate insulating film) 11 formed on the bottom and inside surfaces of a trench which is dug from the surface of $n^+$-type source layer 5 to the upper layer portion of the $n^+$-type epitaxial layer 9; a gate electrode 10 formed in the trench, on the bottom and inside surfaces of which the gate oxide film 11 is formed; an interlayer insulating film 3 which is formed on the gate electrode 10; a p-type base layer 18 which is formed as a guard ring on the surface portion of the $n^+$-type epitaxial layer 9 along the peripheral edge portion of the schottky-barrier diode region 6 on the side of the edge portion of the substrate; an oxide film (insulating film) 4 which is formed so as to cover a connecting portion of the $n^+$-type epitaxial layer 9 to the p-type base layer 18 on the side of the peripheral edge portion of the $n^+$-type epitaxial layer 9; a barrier metal 2 which is formed on the surface in the field effect transistor region 7 and schottky-barrier diode region 6; a metal film 1 which is formed as source and anode electrodes on the surface of the barrier metal 2; and a metal film 13 which is formed as drain and cathode electrodes on the reverse of the $n^{++}$-type semiconductor substrate 12.

The structure of the semiconductor device shown in FIGS. 2 and 3 is a typical structure when the field effect transistor and schottky-barrier diode of the synchronous commutating circuit shown in FIG. 1 are formed on the same substrate.

However, in the structure of the conventional semiconductor device shown in FIGS. 2 and 3, if an inverse bias voltage is applied between the source and drain, i.e., between the anode and cathode, an excessive electric field may be applied to a depletion layer in the guard ring portion of the schottky-barrier diode region 6, i.e., around the p-type base layer 18, to cause a voltage breakdown, so that there is a problem in that the backward withstand voltage is lower than that of a single element in the field effect transistor region 7.

On the other hand, in order to improve the backward withstand voltage in the structure of the conventional semiconductor device, there is considered a means for enhancing the specific resistance of the drift layer ($n^+$-type epitaxial layer 9). If such a means is provided, the on resistance during the forward bias of the field effect transistor increases, so that the problem can not fundamentally be solved.

SUMMARY OF THE INVENTION

A semiconductor device according to one embodiment of the present invention comprises a field effect transistor and a schottky-barrier diode mounted in the same semiconductor substrate, the semiconductor device having buried doped layers buried at a predetermined interval in a drift layer of a first conductivity type in a schottky-barrier diode region so as to have a predetermined depth, the buried doped layers having a second conductivity type.

A semiconductor device according to the first aspect of one embodiment of the present invention comprises:

a semiconductor substrate of a first conductivity type;

a semiconductor layer of the first conductivity type, which is a drift layer formed on the semiconductor substrate;

a first base layer of a second conductivity type, which is formed in the vicinity of a surface in a field effect transistor region of the semiconductor layer;

a source layer of the first conductivity type, which is formed on a surface portion of the first base layer;

a gate insulating film formed on the source layer;

gate electrodes formed on the gate insulating film;

a first metal film formed as source and anode electrodes on the field effect transistor region and a schottky-barrier diode region;

a second metal film formed as drain and cathode electrodes on the reverse of the semiconductor substrate; and buried doped layers of the second conductivity type, which are buried at a predetermined interval in the semiconductor layer in the schottky-barrier diode region so as to have a predetermined depth.

A semiconductor device according to the second aspect of one embodiment of the present invention comprises:

a semiconductor substrate of a first conductivity type;

a semiconductor layer of the first conductivity type, which is a drift layer formed on the semiconductor substrate;

a first base layer of a second conductivity type, which is formed in the vicinity of a surface in a field effect transistor region of the semiconductor layer;

a source layer of the first conductivity type, which is formed on a surface portion of the first base layer;

a plurality of trench gates each formed in a trench which is dug from the surface of the source layer to an upper layer portion of the semiconductor layer, the plurality of trench gates each comprising a gate insulating film formed on an inner surface of the trench and a gate electrode formed on the gate insulating film in the trench;

a first metal film formed as source and anode electrodes on the field effect transistor region and a schottky-barrier diode region;

a second metal film formed as drain and cathode electrodes on the reverse of the semiconductor substrate; and buried doped layers of the second conductivity type, which are buried at a predetermined interval in the semiconductor layer in the schottky-barrier diode region at a predetermined depth and which are buried at the same interval as the gate electrode in the semiconductor layer in the field effect transistor region so as to have such a depth that the buried doped layers contact bottom faces of the trench gates.

DETAILED DESCRIPTION OF THE EMBODIMENTS

Referring now to the accompanying drawings, the embodiments of a semiconductor device according to the present invention will be described below.

Figure 4:
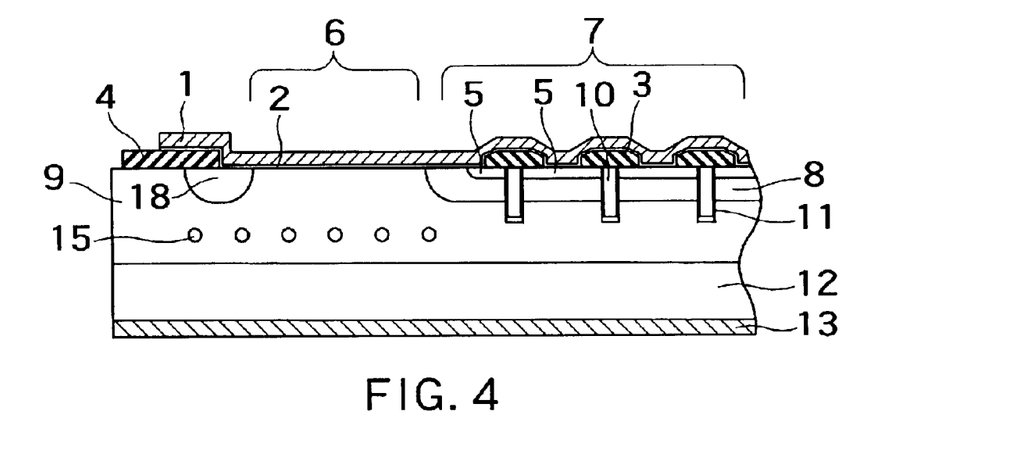
FIG. 4 is a cross-sectional construction drawing of the first embodiment of a semiconductor device according to the present invention.

FIG. 4 is a cross-sectional construction drawing of the first embodiment of a semiconductor device according to the present invention.

The first embodiment of a semiconductor device according to the present invention comprises: an $n^{++}$-type semiconductor substrate 12; an $n^+$-type epitaxial layer (semiconductor layer) 9 which is a drift layer formed on the $n^{++}$-type semiconductor substrate 12; a p-type base layer 8 which is formed in the vicinity of the surface in a field effect transistor region 7 of the $n^+$-type epitaxial layer 9; an $n^+$-type source layer 5 which is formed in the surface portion of the p-type base layer 8; a gate oxide film (gate insulating film) 11 formed on the bottom and inside surfaces of a trench which is dug from the surface of $n^+$-type source layer 5 to the upper layer portion of the $n^+$-type epitaxial layer 9; a gate electrode 10 formed in the trench, on the bottom and inside surfaces of which the gate oxide film 11 is formed; an interlayer insulating film 3 which is formed on the gate electrode 10; a p-type base layer 18 which is formed as a guard ring on the surface portion of the $n^+$-type epitaxial layer 9 along the peripheral edge portion of the schottky-barrier diode region 6 on the side of the edge portion of the substrate; an oxide film (insulating film) 4 which is formed so as to cover a connecting portion of the $n^+$-type epitaxial layer 9 to the p-type base layer 18 on the side of the peripheral edge portion of the $n^+$-type epitaxial layer 9; a barrier metal 2 which is formed on the surface in the field effect transistor region 7 and schottky-barrier diode region 6; a metal film 1 which is formed as source and anode electrodes on the barrier metal 2; a metal film 13 which is formed as drain and cathode electrodes on the reverse of the $n^{++}$-type semiconductor substrate 12; and p-type buried doped layers 15 which are buried in the $n^+$-type epitaxial layer 9 in the schottky-barrier diode region 6 at a predetermined interval so as to have a predetermined depth.

Furthermore, the p-type base layer 8 and the p-type base layer 18 may be formed as a unified diffusion layer or separate diffusion layers.

As described above, the first embodiment of a semiconductor device according to the present invention is a field effect transistor wherein a schottky-barrier diode is mounted on the same semiconductor substrate. In the schottky-barrier diode region 6, p-type buried doped layers 15 are buried in the n⁺-type epitaxial layer 9, which is a drift layer, at a predetermined interval so as to have a predetermined depth.

Although the depth and interval of the buried doped layers 15 are optional, they may be optimized in accordance with required characteristics of the element, since the depth of the buried doped layers 15 influences the withstand voltage of the element and the interval thereof influences the forward resistance of the element.

In order to avoid the breakdown in the depletion layer, the distance between the p-type buried doped layers 15 and the barrier metal 2, and the distance between the p-type buried doped layers 15 and the p-type base layer 8, 18 may be set as follows. That is, if a breakdown occurs before the depletion layer extending from the interface between the barrier metal 2 and the n⁺-type epitaxial layer 9 or the depletion layer extending from the p-type base layer 8, 18 contacts the p-type buried doped layers 15 during a backward bias, the effects of the burying of the p-type buried doped layers 15 can not be obtained, so that the withstand voltage of the whole element is the same as a conventional element wherein the p-type buried dope layers 15 are not buried. Thus, the depletion layer must contact the p-type buried doped layers 15 before the breakdown occurs. Therefore, the distance between the p-type buried doped layers 15 and the barrier metal 2 and the distance between the p-type buried doped layers 15 and the p-type base layer 8, 18 are preferably about ½ or less of a silicon drift layer thickness $t_{drift}$ by the following theoretical expression defined by a breakdown voltage $V_B$.

$$t_{drift} = 2.59 \times 10^{-6} \cdot V_B^{7/6}$$

Figure 5:
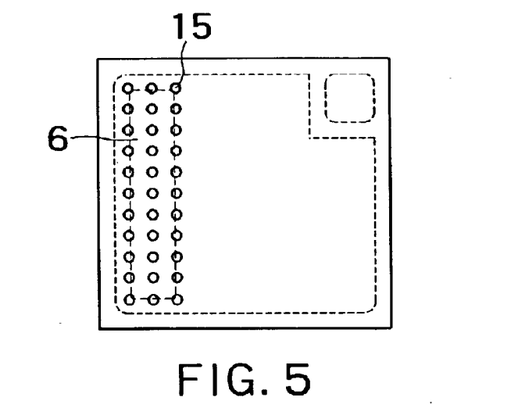
FIG. 5 is a plan view showing a first example of buried doped layers in the first embodiment of a semiconductor device according to the present invention.

FIG. 5 is a plan view showing a first example of buried doped layers in the first embodiment of a semiconductor device according to the present invention.

As shown in FIG. 5, the buried doped layers 15 in the first example are buried in the drift layer in the schottky-barrier diode region 6 at a predetermined interval in the form of dots so as to have a predetermined depth.

Figure 6:
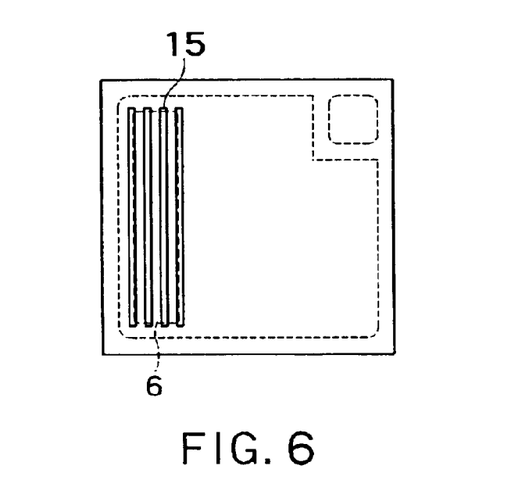
FIG. 6 is a plan view showing a second example of buried doped layers in the first embodiment of a semiconductor device according to the present invention.

FIG. 6 is a plan view showing a second example of buried doped layers in the first embodiment of a semiconductor device according to the present invention.

As shown in FIG. 6, the buried doped layers 15 in the second example are buried in the drift layer in the schottky-barrier diode region 6 at a predetermined interval in the form of stripes so as to have a predetermined depth.

As described above, in the semiconductor device in the first embodiment of the present invention, the p-type buried doped layers 15 are buried in the n⁺-type epitaxial layer 9 in the schottky-barrier diode region 6 at a predetermined interval so as to have a predetermined depth. Therefore, while the on resistance during the forward bias of the field effect transistor is suppressed, the specific resistance of the drift layer in the semiconductor substrate can be enhanced to relieve the electric field in vertical directions in the schottky-barrier diode region to improve the backward withstand voltage.

Specifically, if a backward bias voltage is applied between the source and drain (anode and cathode) of an n-channel type field effect transistor, a depletion layer extends from the schottky-barrier connecting portion to the drift layer, to reach the p-type buried doped layers 15. If a backward voltage is further applied, the depletion layer further extends from the buried doped layers. As a result, the electric field in vertical directions in the schottky-barrier diode region is relieved to improve the backward withstand voltage, and the substantial doped concentration in the drift layer is enhanced to reduce the on resistance during the forward bias of the field effect transistor.

Figure 7:
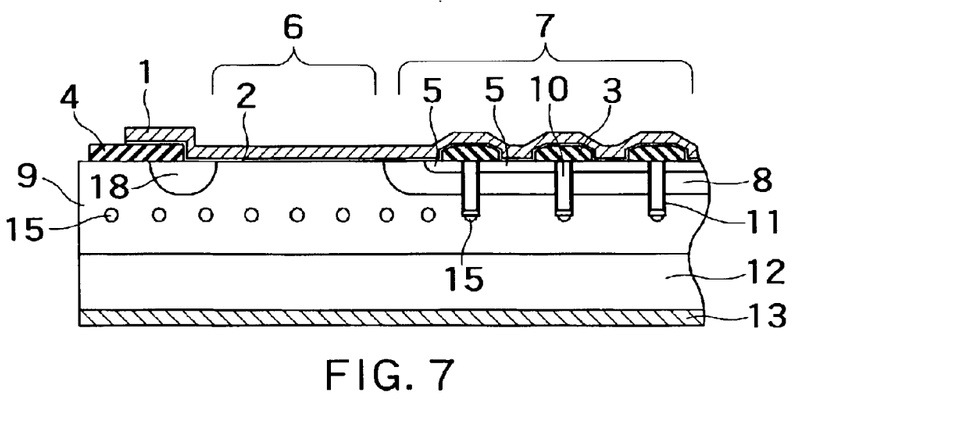
FIG. 7 is a cross-sectional construction drawing of the second embodiment of a semiconductor device according to the present invention.

FIG. 7 is a cross-sectional construction drawing of the second embodiment of a semiconductor device according to the present invention.

The second embodiment of a semiconductor device according to the present invention comprises: an n⁺⁺-type semiconductor substrate 12; an n⁺-type epitaxial layer (semiconductor layer) 9 which is a drift layer formed on the n⁺⁺-type semiconductor substrate 12; a p-type base layer 8 which is formed in the vicinity of the surface in a field effect transistor region 7 of the n⁺-type epitaxial layer 9; an n⁺-type source layer 5 which is formed in the surface portion of the p-type base layer 8; a gate oxide film (gate insulating film) 11 formed on the bottom and inside surfaces of a trench which is dug from the surface of n⁺-type source layer 5 to the upper layer portion of the n⁺-type epitaxial layer 9; a gate electrode 10 formed in the trench, on the bottom and inside surfaces of which the gate oxide film 11 is formed; an interlayer insulating film 3 which is formed on the gate electrode 10; a p-type base layer 18 which is formed as a guard ring on the surface portion of the n⁺-type epitaxial layer 9 along the peripheral edge portion of the schottky-barrier diode region 6 on the side of the edge portion of the substrate; an oxide film (insulating film) 4 which is formed so as to cover a connecting portion of the n⁺-type epitaxial layer 9 to the p-type base layer 18 on the side of the peripheral edge portion of the n⁺-type epitaxial layer 9; a barrier metal 2 which is formed on the surface in the field effect transistor region 7 and schottky-barrier diode region 6; a metal film 1 which is formed as source and anode electrodes on the barrier metal 2; a metal film 13 which is formed as drain and cathode electrodes on the reverse of the n⁺⁺-type semiconductor substrate 12; and p-type buried doped layers 15 which are buried in the n⁺-type epitaxial layer 9 in the schottky-barrier diode region 6 at a predetermined interval so as to have a predetermined depth and which are buried at the same interval as that of the gate electrodes 10 at such a depth that a corresponding one of the buried doped layers 15 contacts the bottom face of the gate oxide film 11 covering the gate electrodes 10 in the n⁺-type epitaxial layer 9 in the field effect transistor region 7.

The different point of the second embodiment of a semiconductor device according to the present invention from the first embodiment of a semiconductor device according to the present invention is that the p-type buried doped layers 15 are not only buried in the n⁺-type epitaxial layer 9 in the schottky-barrier diode region 6, but they are also buried in the n⁺-type epitaxial layer 9 in the field effect transistor region 7 at such a depth that a corresponding one of the buried doped layers 15 contacts the bottom face of the gate oxide film 11 covering the gate electrodes 10.

Thus, when the p-type buried doped layers 15 are buried at the same interval as that of the gate electrodes 10 at such a depth that a corresponding one of the buried doped layers 15 contacts the bottom face of the gate oxide film 11 covering the gate electrodes 10 of the field effect transistor, it is possible to reduce the feedback capacity, and it is possible to accelerate the switching operation of the field effect transistor.

Although the depth and interval of the buried doped layers 15 in the n⁺-type epitaxial layer 9 in the schottky-barrier diode region 6 are optional, they may be optimized in accordance with required characteristics of the element, since the depth of the buried doped layers 15 influences the withstand voltage of the element and the interval thereof influences the forward resistance of the element.

In order to avoid the breakdown in the depletion layer similar to the first embodiment, the distance between the p-type buried doped layers 15 and the barrier metal 2, and the distance between the p-type buried doped layers 15 and the p-type base layer 8, 18 are preferably about ½ or less of a silicon drift layer thickness $t_{drift}$ by the following theoretical expression defined by a breakdown voltage $V_B$.

$$t_{drift} = 2.59 \times 10^{-6} \cdot V_B^{7/6}$$

Figure 8A:
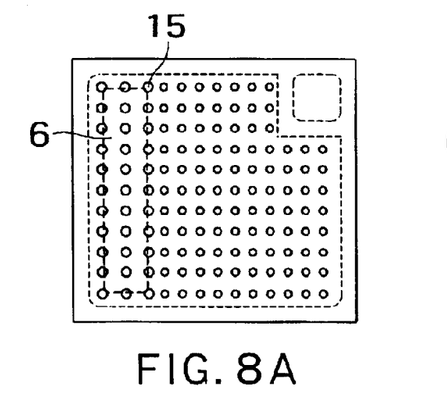
FIGS. 8A, 8B and 8C are plan views showing a first example of buried doped layers in the second embodiment of a semiconductor device according to the present invention.
Figure 8B:
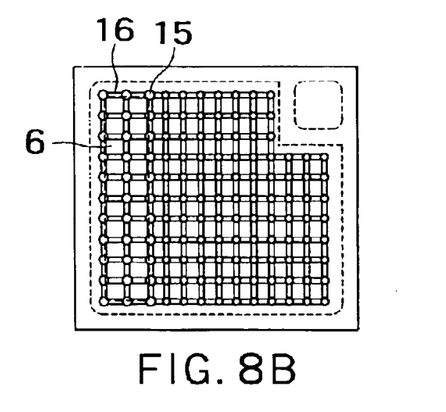
Figure 8C:
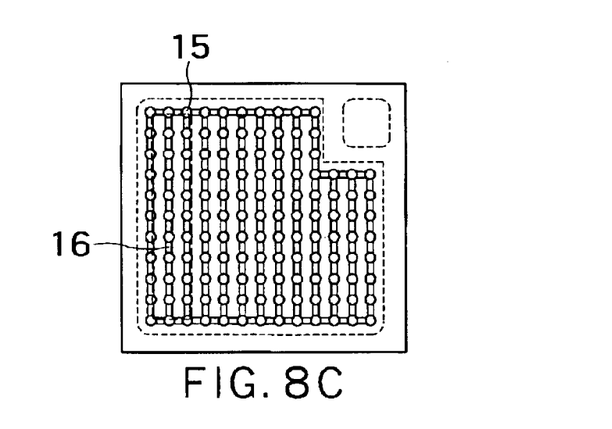

FIGS. 8A, 8B and 8C are plan views showing a first example of buried doped layers in the second embodiment of a semiconductor device according to the present invention.

As shown in FIG. 8A, the buried doped layers 15 in the first example are buried in the form of dots in the drift layer in the schottky-barrier diode region 6 at a predetermined interval so as to have a predetermined depth, and in the field effect transistor region 7 at the same interval as that of the gate electrodes 10 at such a depth that a corresponding one of the buried doped layers 15 contacts the bottom face of the gate oxide film 11 covering the gate electrodes 10 in the drift layer.

If the respective dots of the dot-shaped buried doped layers 15 are formed so as to be completely independent of each other, it may be potentially unstable and it is difficult for carriers to escape, so that the switching speed of the element may decrease. Therefore, as shown in FIGS. 8B and 8C, the respective dots of the dot-shaped buried doped layers 15 may be connected to each other in the form of a lattice or in the form of stripes and a frame by means of connecting stripe-shaped buried doped layers 16 which have a lower impurity concentration than that of the buried dope layers 15 and which have the same conductivity type as that of the buried dope layers 15. Thus, carriers are easy to escape from the buried doped layers 15, so that it is possible to prevent the switching speed of the element from decreasing. Since the on resistance of the field effect transistor is high if the impurity concentration in the connecting stripe-shaped buried doped layers 16 is too high, the impurity concentration in the connecting stripe-shaped buried doped layers 16 may be, e.g., in the range of from about (the impurity concentration in the buried doped layers 15)×10$^{-2}$ to about (the impurity concentration in the buried doped layers 15)×10$^{-3}$.

Figure 9A:
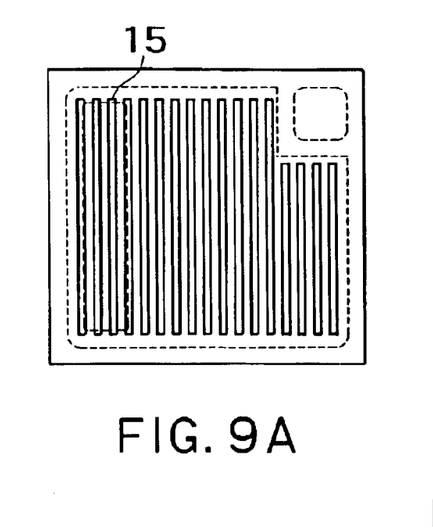
FIGS. 9A, 9B and 9C are plan views showing a second example of buried doped layers in the second embodiment of a semiconductor device according to the present invention.
Figure 9B:
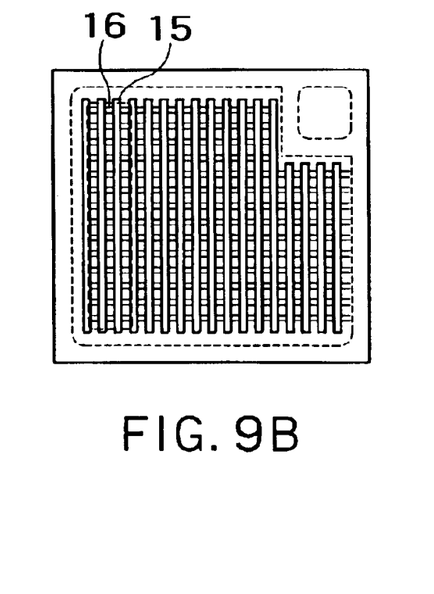
Figure 9C:
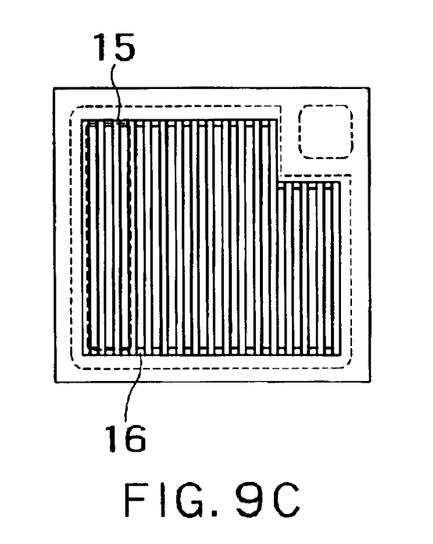

FIGS. 9A, 9B and 9C are plan views showing a second example of buried doped layers in the second embodiment of a semiconductor device according to the present invention.

As shown in FIG. 9A, the buried doped layers 15 in the second example are buried in the form of stripes in the drift layer in the schottky-barrier diode region 6 at a predetermined interval so as to have a predetermined depth, and in the field effect transistor region 7 at the same interval as that of the gate electrodes 10 at such a depth that a corresponding one of the buried doped layers 15 contacts the bottom face of the gate oxide film 11 covering the gate electrodes 10 in the drift layer.

Also in a case where the stripe-shaped buried doped layers 15 are formed, in order to prevent the switching speed of the element from decreasing, as shown in FIGS. 9B and 9C, the stripe-shaped buried doped layers 15 may be connected to each other in the form of a lattice or in the form of a frame by means of connecting stripe-shaped buried doped layers 16 which are orthogonal with the stripe-shaped buried doped layers 15 and which have a lower impurity concentration than that of the buried dope layers 15 and which have the same conductivity type as that of the buried dope layers 15.

Figure 10A:
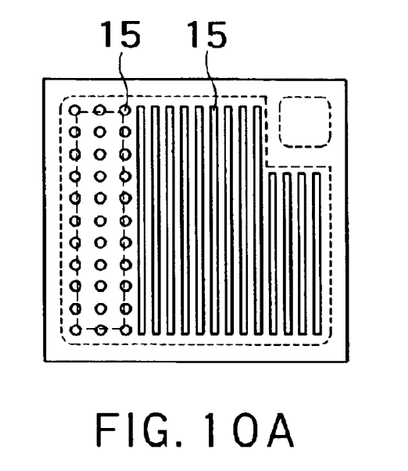
FIGS. 10A, 10B and 10C are plan views showing a third example of buried doped layers in the second embodiment of a semiconductor device according to the present invention.
Figure 10B:
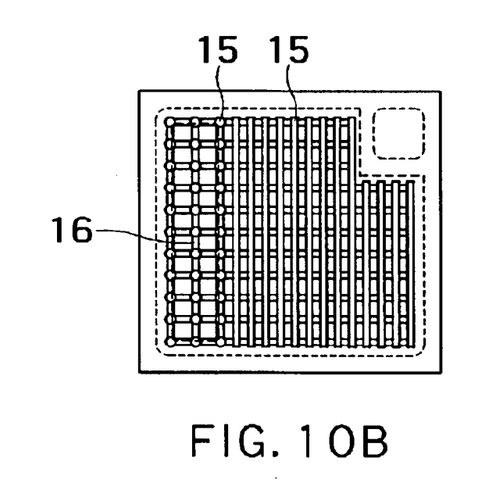
Figure 10C:
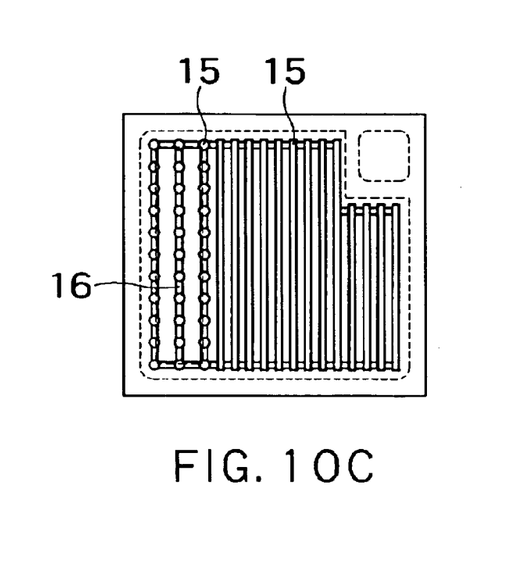

FIGS. 10A, 10B and 10C are plan views showing a third example of buried doped layers in the second embodiment of a semiconductor device according to the present invention.

As shown in FIG. 10A, the buried doped layers 15 in the third example are buried in the form of dots in the drift layer in the schottky-barrier diode region 6 at a predetermined interval so as to have a predetermined depth, and are buried in the form of stripes in the drift layer in the field effect transistor region 7 at the same interval as that of the gate electrodes 10 at such a depth that a corresponding one of the buried doped layers 15 contacts the bottom face of the gate oxide film 11 covering the gate electrodes 10 in the drift layer.

Also in a case where the dot-shaped buried doped layers 15 are formed in the schottky-barrier diode region 6 and the stripe-shaped buried doped layers 15 are formed in the field effect transistor region 7, in order to prevent the switching speed of the element from decreasing, as shown in FIGS. 10B and 10C, the dot-shaped and stripe-shaped buried doped layers 15 may be connected to each other in the form of a lattice or in the form of stripes and a frame by means of connecting stripe-shaped buried doped layers 16 which have a lower impurity concentration than that of the buried dope layers 15 and which have the same conductivity type as that of the buried dope layers 15.

Figure 11A:
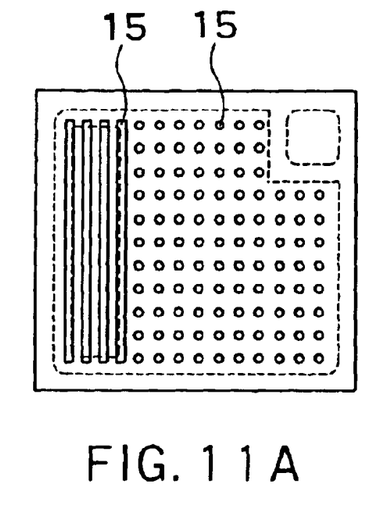
FIGS. 11A, 11B and 11C are plan views showing a fourth example of buried doped layers in the second embodiment of a semiconductor device according to the present invention.
Figure 11B:
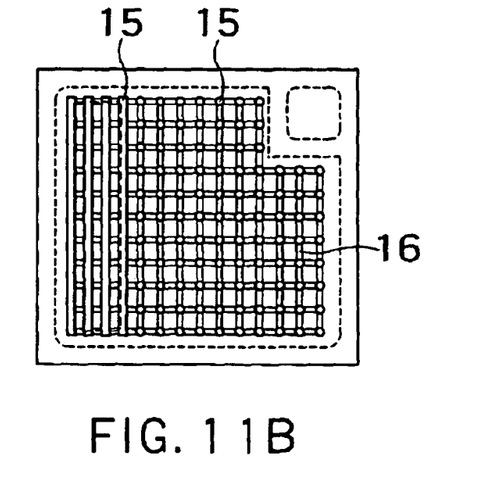
Figure 11C:
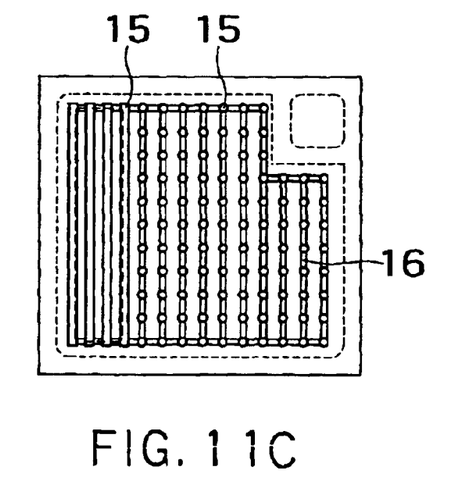

FIGS. 11A, 11B and 11C are plan views showing a fourth example of buried doped layer in the second embodiment of a semiconductor device according to the present invention.

As shown in FIG. 11A, the buried doped layers 15 in the fourth example are buried in the form of stripes in the drift layer in the schottky-barrier diode region 6 at a predetermined interval so as to have a predetermined depth, and are buried in the form of dots in the drift layer in the field effect transistor region 7 at the same interval as that of the gate electrodes 10 at such a depth that a corresponding one of the buried doped layers 15 contacts the bottom face of the gate oxide film 11 covering the gate electrodes 10 in the drift layer.

Also in a case where the stripe-shaped buried doped layers 15 are formed in the schottky-barrier diode region 6 and the dot-shaped buried doped layers 15 are formed in the field effect transistor region 7, in order to prevent the switching speed of the element from decreasing, as shown in FIGS. 11B and 11C, the stripe-shaped and dot-shaped buried doped layers 15 may be connected to each other in the form of a lattice or in the form of stripes and a frame by means of connecting stripe-shaped buried doped layers 16 which have a lower impurity concentration than that of the buried dope layers 15 and which have the same conductivity type as that of the buried dope layers 15.

As described above, in the semiconductor device in the second embodiment of the present invention, the p-type buried doped layers 15 are not only buried in the n$^+$-type epitaxial layer 9 in the schottky-barrier diode region 6, but they are also buried in the n$^+$-type epitaxial layer 9 in the field effect transistor region 7 at the same interval as that of the gate electrodes 10 at such a depth that a corresponding one of the buried doped layers 15 contacts the bottom face of the gate oxide film 11 covering the gate electrodes 10. Therefore, in addition to the same effects of the first embodiment, it is possible to reduce the feedback capacity of the gate oxide film 11, so that it is possible to further accelerate the switching operation of the field effect transistor.

Next, one embodiment of a method for producing a semiconductor device according to the present invention will be described below.

A process for forming buried doped layers 15 will be described. First, a photosensitive resist is applied on the surface of a semiconductor substrate on which an n$^+$-type epitaxial layer 9 being a drift layer has been formed by the epitaxial crystal growth so as to have a thickness being a part of a final thickness. Then, the substrate is exposed and developed to form a mask of a pattern of buried doped layers 15. The depth of the buried doped layers 15 is determined by the thickness of the n$^+$-type epitaxial layer 9 formed at that time, and the thickness of the n$^+$-type epitaxial layer 9 further grown after the buried doped layers 15 are formed.

It is determined by the patterning of this resist whether the buried doped layers 15 are formed only in the schottky-barrier diode region 6 as the semiconductor device in the first embodiment of the present invention or the buried doped layers 15 are formed in the schottky-barrier diode region 6 and the field effect transistor region 7 as the semiconductor device in the second embodiment of the present invention. Furthermore, if the buried doped layers 15 are buried at the same interval as that of the gate electrodes 10 so as to contact the bottom face of the gate insulating film 11 covering the gate electrodes 10 in the n$^+$-type epitaxial layer 9 in the field effect transistor region 7 as the semiconductor device in the second embodiment of the present invention, aligning marks may be previously formed when the resist is patterned.

After the pattern of the resist is formed, an impurity, e.g., boron (B), for forming the p-type buried doped layers 15 is injected. After the impurity is injected, the resist is removed.

If the connecting stripe-shaped buried doped layers 16 are formed as shown in FIGS. 8B, 8C, 9B, 9C, 10B, 10C, 11B and 11C, the processes for patterning the resist, injecting the impurity and removing the resist are repeated.

After the impurity is injected, the n$^+$-type epitaxial layer 9 is further grown by the CVD method so as to have the final thickness.

Thereafter, a schottky-barrier diode and a field effect transistor are formed by a usual process, so that one embodiment of a semiconductor device according to the present invention is completed.

In one embodiment of a semiconductor device according to the present invention wherein the trench gate type field effect transistor and the schottky-barrier diode are mounted in the same semiconductor substrate, a first conductivity type buried doped layers are buried at a predetermined interval in a second conductivity type drift layer in the schottky-barrier diode region so as to have a predetermined depth. Therefore, while the doped concentration in the drift layer is substantially enhanced to suppress the on resistance during the forward bias of the field effect transistor, the specific resistance of the drift layer in the semiconductor substrate can be enhanced to relieve the electric field in vertical directions in the schottky-barrier diode region to improve the backward withstand voltage.

If the buried doped layers are also buried at the same interval as that of the gate electrodes so as to have such a depth that the buried doped layers contact the bottom face of the gate oxide film covering the gate electrodes in the drift layer in the field effect transistor region, it is possible to reduce the feedback capacity of the gate oxide film, so that it is possible to further accelerate the switching operation of the field effect transistor.

What is claimed is:

1. A semiconductor device comprising:
   a field effect transistor;
   a schottky-barrier diode mounted in a same semiconductor substrate as said field effect transistor; and
   buried doped layers spaced at a predetermined interval and buried at a predetermined depth in a drift layer of a first conductivity type in a schottky-barrier diode region, said buried doped layers having a second conductivity type.

2. A semiconductor device as set forth in claim 1, wherein said buried doped layers are spaced at a same interval as gate electrodes in said drift layer in a field effect transistor region, such that said buried doped layers contact a bottom face of a gate insulating film covering said gate electrodes.

3. A semiconductor device as set forth in claim 1, wherein said field effect transistor is of a trench gate type.

4. A semiconductor device comprising:
   a semiconductor substrate of a first conductivity type;
   a semiconductor layer of the first conductivity type and forming a drift layer on said semiconductor substrate;
   a first base layer of a second conductivity type, which is formed in the vicinity of a surface in a field effect transistor region of said semiconductor layer;
   a source layer of the first conductivity type and formed on a surface of said first base layer;
   a gate insulating film formed on said source layer;
   a gate electrode formed on said gate insulating film;
   a first metal film formed as source and anode electrodes on said field effect transistor region and a schottky-barrier diode region, respectively;
   a second metal film formed as drain and cathode electrodes on the reverse of said semiconductor substrate; and
   buried doped layers of the second conductivity type spaced at a predetermined interval and buried at a predetermined depth in said semiconductor layer in said schottky-barrier diode region.

5. A semiconductor device as set forth in claim 4, wherein said buried doped layers are dot-shaped.

6. A semiconductor device as set forth in claim 4, wherein said buried doped layers are stripe-shaped.

7. A semiconductor device as set forth in claim 4, wherein said gate insulating film is formed on an inner surface of a trench which is dug from the surface of said source layer to an upper layer of said semiconductor layer, and
   said gate electrode being formed on said gate insulating film in the trench.

8. A semiconductor device as set forth in claim 4, further comprising:
   a second base layer of the second conductivity type, which is formed as a guard ring in the surface portion of said semiconductor layer along a peripheral edge portion of said semiconductor layer; and
   an insulating film formed so as to cover a junction of said semiconductor layer to said second base layer on the side of a peripheral edge portion of said semiconductor substrate.

9. A semiconductor device as set forth in claim 4, further comprising a barrier metal formed as a bedding metal film of said first metal film.

10. A semiconductor device comprising:
    a semiconductor substrate of a first conductivity type;
    a semiconductor layer of the first conductivity type, which is a drift layer formed on said semiconductor substrate;

a first base layer of a second conductivity type, which is formed in the vicinity of a surface in a field effect transistor region of said semiconductor layer;

a source layer of the first conductivity type, which is formed on a surface portion of said first base layer;

a plurality of trench gates each formed in a trench which is dug from the surface of said source layer to an upper layer portion of said semiconductor layer, said plurality of trench gates each comprising a gate insulating film formed on an inner surface of the trench and a gate electrode formed on said gate insulating film in the trench;

a first metal film formed as source and anode electrodes on said field effect transistor region and a schottky-barrier diode region, respectively;

a second metal film formed as drain and cathode electrodes on the reverse of said semiconductor substrate; and buried doped layers of the second conductivity type, which are buried at a predetermined interval in said semiconductor layer in said schottky-barrier diode region at a predetermined depth and which are buried at the same interval as said gate electrode in said semiconductor layer in said field effect transistor region so as to have such a depth that said buried doped layers contact bottom faces of said trench gates.

11. A semiconductor device as set forth in claim 10, wherein said buried doped layers are dot-shaped.

12. A semiconductor device as set forth in claim 11, wherein said buried doped layers are connected to each other in the form of a lattice via connecting stripe-shaped buried doped layers of the second conductivity type.

13. A semiconductor device as set forth in claim 12, wherein said connecting stripe-shaped buried doped layers have a lower impurity concentration than that of said buried doped layers.

14. A semiconductor device as set forth in claim 11, wherein said buried doped layers are connected to each other in the form of a frame and stripes via connecting stripe-shaped buried doped layers of the second conductivity type.

15. A semiconductor device as set forth in claim 14, wherein said connecting stripe-shaped buried doped layers have a lower impurity concentration than that of said buried doped layers.

16. A semiconductor device as set forth in claim 10, wherein said buried doped layers are stripe-shaped.

17. A semiconductor device as set forth in claim 16, wherein said buried doped layers are connected to each other in the form of a lattice via connecting stripe-shaped buried doped layers of the second conductivity type.

18. A semiconductor device as set forth in claim 17, wherein said connecting stripe-shaped buried doped layers have a lower impurity concentration than that of said buried doped layers.

19. A semiconductor device as set forth in claim 16, wherein said buried doped layers are connected to each other in the form of a frame via connecting stripe-shaped buried doped layers of the second conductivity type.

20. A semiconductor device as set forth in claim 19, wherein said connecting stripe-shaped buried doped layers have a lower impurity concentration than that of said buried doped layers.

21. A semiconductor device as set forth in claim 10, wherein said buried doped layers are dot-shaped in said schottky-barrier diode region and stripe-shaped in said field effect transistor region.

22. A semiconductor device as set forth in claim 21, wherein said buried doped layers are connected to each other in the form of a lattice via connecting stripe-shaped buried doped layers of the second conductivity type.

23. A semiconductor device as set forth in claim 22, wherein said connecting stripe-shaped buried doped layers have a lower impurity concentration than that of said buried doped layers.

24. A semiconductor device as set forth in claim 21, wherein said buried doped layers are connected to each other in the form of a frame and stripes via connecting stripe-shaped buried doped layers of the second conductivity type.

25. A semiconductor device as set forth in claim 24, wherein said connecting stripe-shaped buried doped layers have a lower impurity concentration than that of said buried doped layers.

26. A semiconductor device as set forth in claim 10, wherein said buried doped layers are stripe-shaped in said schottky-barrier diode region and dot-shaped in said field effect transistor region.

27. A semiconductor device as set forth in claim 26, wherein said buried doped layers are connected to each other in the form of a lattice via connecting stripe-shaped buried doped layers of the second conductivity type.

28. A semiconductor device as set forth in claim 27, wherein said connecting stripe-shaped buried doped layers have a lower impurity concentration than that of said buried doped layers.

29. A semiconductor device as set forth in claim 26, wherein said buried doped layers are connected to each other in the form of a frame and stripes via connecting stripe-shaped buried doped layers of the second conductivity type.

30. A semiconductor device as set forth in claim 29, wherein said connecting stripe-shaped buried doped layers have a lower impurity concentration than that of said buried doped layers.

31. A semiconductor device as set forth in claim 10, further comprising:

a second base layer of the second conductivity type, which is formed as a guard ring in the surface portion of said semiconductor layer along a peripheral edge portion of said semiconductor layer; and an insulating film formed so as to cover a junction portion of said semiconductor layer to said second base layer on the side of a peripheral edge portion of said semiconductor substrate.

32. A semiconductor device as set forth in claim 10, further comprising a barrier metal formed as a bedding metal film of said first metal film.

* * * * *